United States Patent
Sakellariou et al.

(10) Patent No.: US 8,773,230 B2
(45) Date of Patent: Jul. 8, 2014

(54) ASSEMBLY OF MAGNETISED COAXIAL STRUCTURES INDUCING A LONGITUDINAL HOMOGENEOUS FIELD IN THE CENTRE THEREOF

(75) Inventors: Dimitrios Sakellariou, Boulogne Billancourt (FR); Cédric Hugon, Clamart (FR); Guy Aubert, Poitiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/063,870

(22) PCT Filed: Aug. 27, 2010

(86) PCT No.: PCT/FR2010/051783
§ 371 (c)(1),
(2), (4) Date: Aug. 5, 2011

(87) PCT Pub. No.: WO2011/023912
PCT Pub. Date: Mar. 3, 2011

(65) Prior Publication Data
US 2011/0291781 A1 Dec. 1, 2011

(30) Foreign Application Priority Data
Aug. 28, 2009 (FR) ...................................... 09 55891

(51) Int. Cl.
H01F 3/00 (2006.01)
H01F 7/00 (2006.01)
H01F 7/02 (2006.01)
(52) U.S. Cl.
USPC ............................. 335/302; 335/296; 324/318
(58) Field of Classification Search
USPC ................. 335/210, 212, 284, 302–306, 296; 324/318–320
See application file for complete search history.

(56) References Cited

U.S. PATENT DOCUMENTS

| 2,960,649 | A | | 11/1960 | Bloch |
| 5,014,032 | A | | 5/1991 | Aubert |
| 5,428,333 | A | * | 6/1995 | Abele et al. ................... 335/306 |
| 6,163,240 | A | | 12/2000 | Zuk et al. |

(Continued)

FOREIGN PATENT DOCUMENTS

| FR | 1 100 721 | 9/1955 |
| WO | WO 2006/024775 | 3/2006 |

*Primary Examiner* — Bernard Rojas
(74) *Attorney, Agent, or Firm* — Prieti Flaherty Beliveau & Pachios LLP

(57) ABSTRACT

The magnetized structure that induces in a central area of interest a homogeneous magnetic field oriented along a longitudinal axis (z) of the structure comprises first and second magnetized rings (111, 121) disposed symmetrically relative to a plane (P) that is perpendicular to said longitudinal axis (z) and that contains said central area of interest, and one median annular magnetized structure (330) disposed between the first and second magnetized rings (111, 121) and also disposed symmetrically relative to the plane (P) of symmetry. The first magnetized ring (111) is magnetized radially relative to the longitudinal axis (z) with divergent magnetization, the second magnetized ring (121) is magnetized radially relative to the longitudinal axis (z) with convergent magnetization, and the median annular magnetized structure (330) is magnetized along the longitudinal axis (z). The median annular magnetized structure (330) is divided into at least two slices (331A, 331B, 332A, 332B) along the longitudinal axis (z) and the first and second magnetized rings (111, 121) and the various slices (331A, 331B, 332A, 332B) of the median magnetized structure (130) are each divided into identical components in the form of regularly distributed sectors.

17 Claims, 4 Drawing Sheets

(56) References Cited

U.S. PATENT DOCUMENTS 6,313,551 B1 * 11/2001 Hazelton .................. 310/12.24
6,680,663 B1 * 1/2004 Lee et al. ..................... 335/306
2008/0296494 A1 * 12/2008 Heninger et al. ............ 250/292

* cited by examiner

ASSEMBLY OF MAGNETISED COAXIAL STRUCTURES INDUCING A LONGITUDINAL HOMOGENEOUS FIELD IN THE CENTRE THEREOF

FIELD OF THE INVENTION

The present invention relates to a magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first ring being magnetized radially relative to the longitudinal axis with divergent magnetization, the second ring being magnetized radially relative to the longitudinal axis with convergent magnetization, and the median annular structure being magnetized along the longitudinal axis.

PRIOR ART

In the field of nuclear magnetic resonance (NMR), the sample (object or patient) is placed inside a magnetic field that must be very intense and very homogeneous. It is therefore necessary to be able to manufacture magnetized structures capable of producing such magnetic fields.

The magnets used at present in NMR to create intense and homogeneous fields are for the most part based on the flow of current in windings. Whether the windings are resistive or superconducting, it is always necessary to supply the magnet with current and also with cryogenic fluids for superconducting windings. Because of this, the devices are bulky and difficult to move. Resistive windings require high-current feeds, while superconducting windings imply the use of a cryostat filled with cryogenic liquids, which is difficult to move.

A structure based on permanent magnets makes it possible to circumvent those constraints because the material is magnetized once and for all and, if it is manipulated appropriately, retains its magnetization without exterior maintenance. Moreover, so-called permanent materials are limited in terms of remanence (the magnetization remaining in the material once magnetized) and generating high fields in large areas of use requires large quantities of material. Since the density of these materials is approximately 7.5 g·cm$^{-3}$, these systems quickly become very heavy. It is therefore important to minimize the quantity of material for a given field.

The difficulty with magnetic systems using permanent materials for NMR lies in the requirement to combine intense fields with high homogeneity. The methods of producing materials such as NdFeB cannot guarantee perfect homogeneity of magnetization or perfect repetitivity. Also, although it is possible to calculate structures providing the required homogeneity, it is necessary to provide for the possibility of a posteriori adjustments for correcting imperfections of the material.

The overall shape of those magnetized structures is generally cylindrical, where the structure has at least axial symmetry. That makes it possible to circumvent numerous factors of inhomogeneity. The area of interest is then at the center of the cylinder and access to this area may be effected along the axis by opening up a hole in the cylinder, or from the side by splitting the cylinder in two.

In the past, very few structures based on permanent magnets have been proposed for generating a homogeneous longitudinal field at the center. This is because the NMR applications that require high homogeneity also require the devices to be either very large (in MRI where a human body must be placed inside the device), which implies an enormous quantity of material (several tons), or very intense (in NMR spectroscopy, which uses fields exceeding 10 teslas (T), at present up to 20 T), which is simply not feasible at present with permanent materials.

The earliest patent relating to a cylindrical permanent magnet structure generating a homogeneous longitudinal field suitable a priori for NMR is that of Guy Aubert dating from 1991 (U.S. Pat. No. 5,014,032). That proposes using rings of permanent material magnetized radially. The rings are magnetized towards the axis of symmetry on one side of the useful area and outwards on the other side of the useful area. The structure is symmetrical relative to the plane orthogonal to the axis of symmetry and containing the center of the useful area.

Nowadays there is renewed interest in structures based on permanent materials because they are very suited to portable or transportable low-field NMR applications. Moreover, new magnetic materials offer much higher remanence and coercivity, making possible induced fields sufficient for applications in NMR (hundreds of milliteslas (mT)). Finally, these materials lend themselves readily to rotation, which should make it possible to obtain an improvement in resolution, as in the method proposed by Bloch (U.S. Pat. No. 2,960,649), this time by spinning the field, not the sample.

In 2006 Heninger et al. proposed a structure for generating a longitudinal field in the context of an ion trap (patent application WO 2006/024775). That magnet makes possible homogeneity of one per thousand in a volume of 10 cubic centimeters (cm$^3$) with a field of 1 T. That structure therefore does not make possible homogeneity as required for NMR, but produces a field comparable in magnitude to that of certain medical imaging devices (1.5 T). Moreover, the proposed structure is not simple to manufacture.

DEFINITION AND OBJECT OF THE INVENTION

The present invention aims to remedy the drawbacks referred to above and in particular to offer a solution to the problem of assembling magnetized parts to form powerful permanent magnets capable of creating a homogeneous and intense field at the center of the magnetized structure, the induced field being oriented along the longitudinal axis of the structure.

The invention may find applications inter alia in the fields of "light" NMR or rotating field MRI-NMR.

Generally speaking, the present invention aims to make it possible to produce a magnetized structure inducing at its center a homogeneous field.

The above objects are achieved, in accordance with the invention, by means of a magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors.

The median annular magnetized structure is preferably divided into at least four slices.

The first and second magnetized rings have in the direction of the longitudinal axis a thickness greater than that of each slice of the median annular magnetized structure.

The first and second magnetized rings and each slice of the median annular magnetized structure are preferably divided into at least twelve sector-shaped components.

In an advantageous embodiment that facilitates production, the interior and exterior cylindrical walls of the first and second magnetized rings and the median annular magnetized structure have a polygonal section in a plane perpendicular to said longitudinal axis.

All the components of the first and second magnetized rings may be contiguous.

In one particular possible embodiment all the components of each slice of the median annular magnetized structure are contiguous.

In another embodiment that is particularly advantageous for producing the assembly, all the components of each slice of the median annular magnetized structure are non-contiguous. For the same slice, these non-contiguous elements are thicker than the contiguous elements in a slice with contiguous elements and are therefore less fragile, and they extend over a narrower angular sector, producing gaps between non-contiguous elements that facilitate manipulation during assembly.

The gaps between non-contiguous elements may remain empty or they may allow the insertion of mechanical adjustment elements that may optionally be magnetic.

In one particular embodiment, the non-contiguous components of the various slices of the median annular magnetized structure are superposed on each other and aligned with each other along the longitudinal axis.

In another particular embodiment, the non-contiguous components of each slice of the median annular magnetized structure are offset angularly relative to the non-contiguous components of the other immediately adjacent slices.

In a further particular embodiment, the non-contiguous components of the slices of the median annular magnetized structure are alternately offset angularly relative to the non-contiguous components of another, immediately adjacent slice and superposed relative to the non-contiguous components of another, immediately adjacent slice, being aligned therewith along the longitudinal axis.

The magnetized structure of the invention may be applied to a nuclear magnetic resonance device.

BRIEF DESCRIPTION OF THE DRAWINGS

Other features and advantages of the invention emerge from the following description of particular embodiments given by way of example with reference to the appended drawings, in which.

DETAILED DESCRIPTION OF PREFERRED EMBODIMENTS

Generally speaking, the present invention relates to a method of assembling magnetized parts in order to create a homogeneous and intense magnetic field at the center of the structure. The field induced at the center is oriented along the axis of the structure. The field obtained may be rendered arbitrarily homogeneous by choosing the number and the dimensions of the elements according to certain general rules discussed below. A structure of this kind is of particular interest for NMR and MRI.

Figure 1:
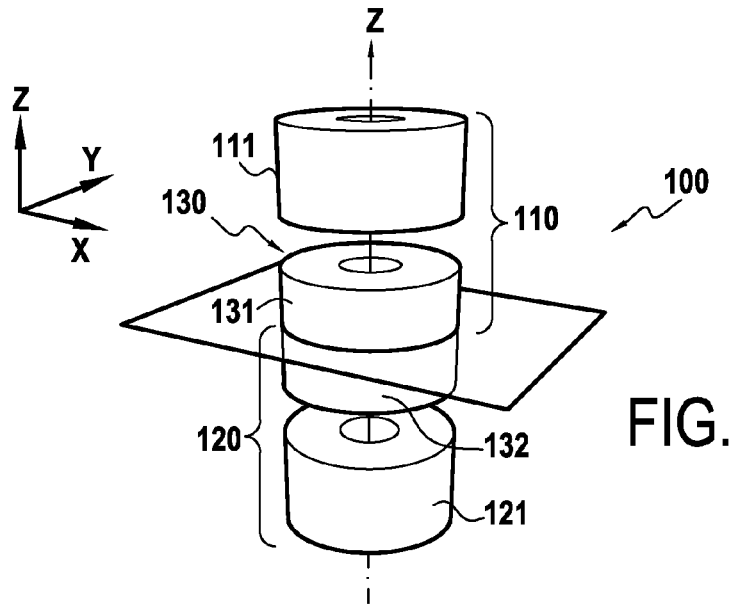
FIG. 1 is a diagrammatic overall perspective view of an axisymmetrical magnetized structure of the invention.

Turning to FIG. 1, there is seen an essentially axisymmetrical magnetized structure that consists of an assembly of annular cylindrical elements constituting permanent magnets. These annular elements are aligned along the same longitudinal axis z and are symmetrical relative to a plane P. The center of the region of interest where an intense and homogeneous field must be created is situated at the intersection of the axis z and the plane P. The overall structure is cylindrical with a central hole that extends along the axis z and provides access to the center of the region of interest.

There is more particularly seen in FIG. 1 a device 100 constituting a hybrid assembly of magnetized structures in the form of rings and including firstly first and second annular magnetized structures 111, 121 symmetrically disposed relative to the plane P that is perpendicular to the longitudinal axis z and contains the central area of interest and secondly a third annular magnetized structure 130 with two parts 131, 132 disposed between the structures 111 and 121 in the form of rings and also symmetrically disposed relative to the plane P.

This produces two sets 110 and 120 symmetrical relative to the plane P. The set 110 comprises the ring 111 and the half 131 of the median structure 130 while the set 120 comprises the ring 121 and the half 132 of the median structure 130. The symmetry relative to the plane P allows cancellation of all the odd terms in the expansion into regular solid spherical harmonics of the component $B_z$ of the magnetic field produced in the vicinity of the center of the area of interest.

Figure 2:
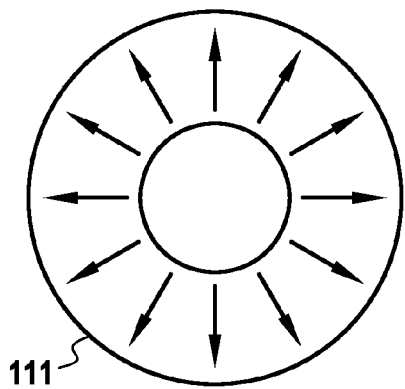
FIG. 2 shows the orientation of the magnetization in a divergent radial magnetization ring usable in a magnetized structure of the invention.
Figure 3:
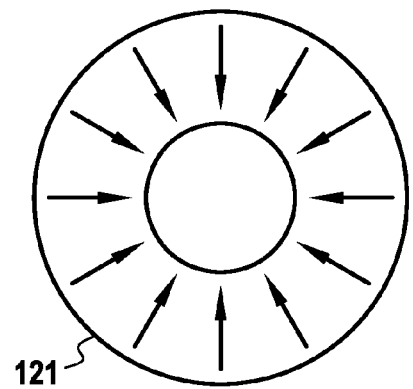
FIG. 3 shows the orientation of the magnetization in a convergent radial magnetization ring usable in a magnetized structure of the invention.
Figure 4:
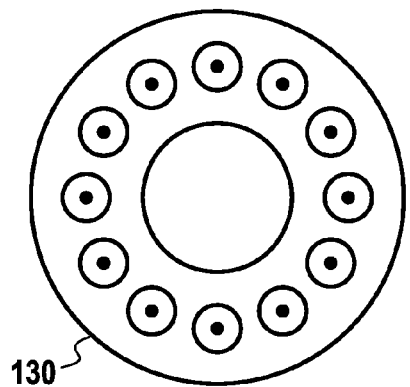
FIG. 4 shows the orientation of the magnetization in a longitudinal magnetization median annular structure usable in a magnetized structure of the invention.
Figure 5:
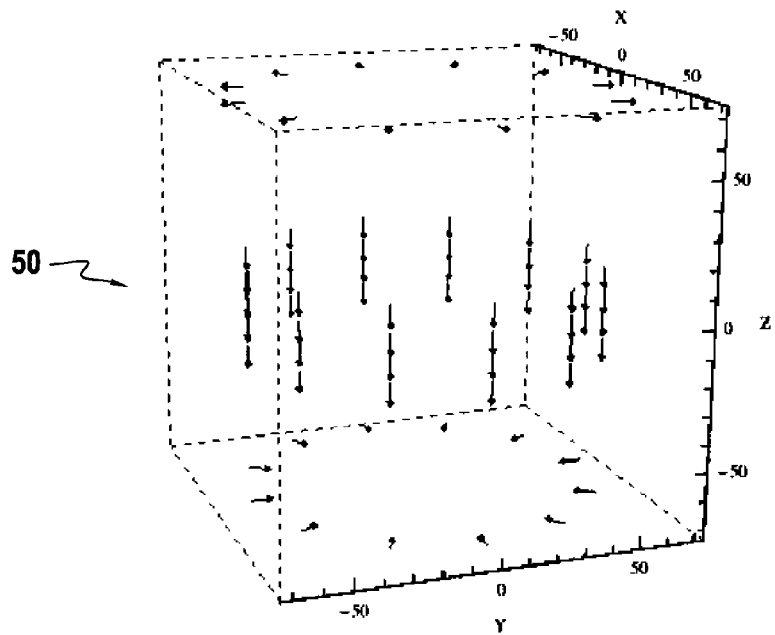
FIG. 5 is a diagrammatic representation of the magnetization orientation of the different components of one example of a magnetized structure of the invention with a longitudinal induced field.

The magnetized ring 111 is magnetized radially relative to the axis z with divergent magnetization (see FIG. 2) while the magnetized ring 121 is magnetized radially relative to the axis z with convergent magnetization (see FIG. 3). The median magnetized structure 132 is magnetized along the longitudinal axis z (see FIG. 4). There is created in this way a hybrid structure 50 as shown in FIG. 5 in which is seen the orientation of the magnetization of the different components of the magnetized structure.

The median magnetized structure 130 with longitudinal magnetization is divided into relatively thin slices along the axis z and may comprise four slices, for example, while the rings 111, 121 with radial magnetization may comprise only one thick slice.

Figure 6:
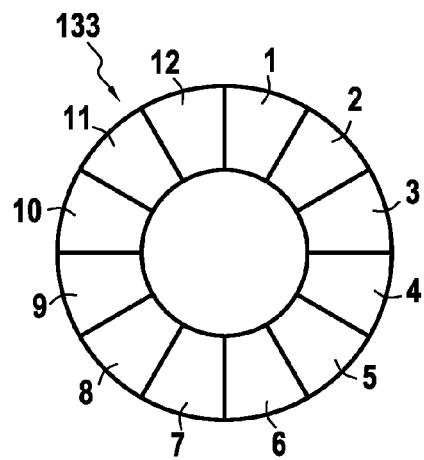
FIG. 6 is a top view showing one possible median annular magnetized structure shape with division into contiguous sectors.

As may be seen in FIG. 6, each slice 133 of the median magnetized structure 130 may be divided into components in the form of regularly distributed identical contiguous sectors identified by the reference numbers 1 to 12 in FIG. 6. The invention is nevertheless not limited to 12 sectors and the number of sectors could be different from 12. The use of 12 sectors in each ring constitutes a preferred embodiment with a satisfactory order of homogeneity. A smaller number of sectors, for example ten sectors, or even fewer, also allows useful results, but with slightly degraded homogeneity. To improve the homogeneity even more, each slice may be divided into more than 12 sectors.

The magnetized rings 111 and 121 are also divided in the same way into components in the form of regularly distributed identical contiguous sectors. This constitutes a simple and effective preferred embodiment, the median sectors themselves allowing certain adjustments to be carried out a posteriori.

Nevertheless, if necessary, the magnetized rings 111 and 121 could themselves be formed of components in the form of regularly distributed non-contiguous identical sectors, in order to offer an additional possibility of fine adjustment a posteriori.

Figure 8:
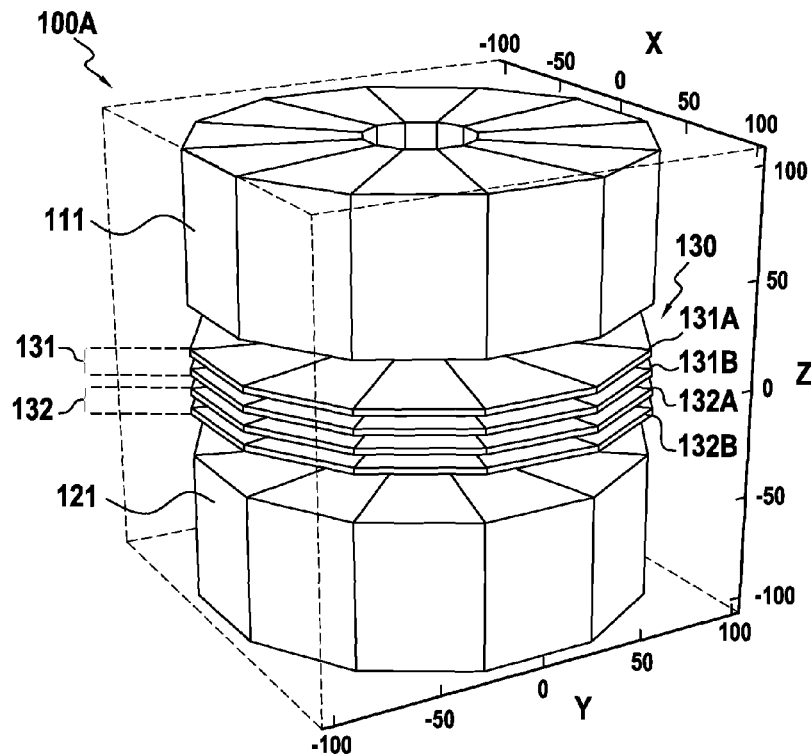
FIG. 8 is a perspective view of one embodiment of a magnetized structure of the invention of polygonal section and with a median annular magnetized structure including division into contiguous sectors.

Generally speaking, it is advantageous to produce each annular cylindrical structure in the form of a regular polyhedral structure comprising a set of N identical segments. Thus each segment is a right-angle prism of isosceles trapezoidal section and its magnetization is parallel to the height of the prism or at a predetermined angle to that height. One example of such a structure 100A is represented in FIG. 8. Note that if the median magnetized structure 130 is divided into contiguous sectors, as shown in FIG. 6, for example, the various slices 131A, 131B, 132A, 132B constituting this median magnetized structure are relatively thin, which can make these elements somewhat fragile.

Figure 7:
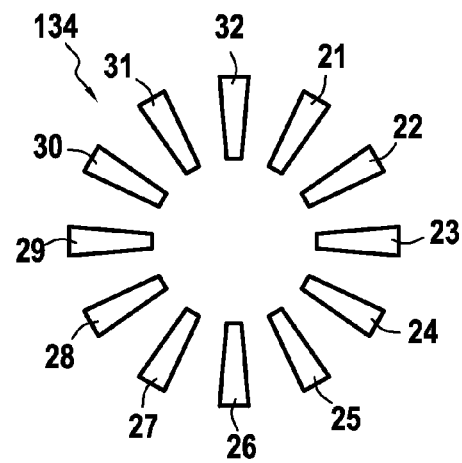
FIG. 7 is a top view showing one possible median annular magnetized structure shape with division into non-contiguous sectors.

Each sector-shaped elementary segments of a slice of the median magnetized structure 130 may be non-contiguous with the adjacent segments. FIG. 7 shows one embodiment of an elementary slice 134 of the median magnetized structure 130 with non-contiguous elementary segments 21 to 32. Various embodiments of magnetized structures 100B, 100C, 100D are described below with reference to FIGS. 9 to 11 that have a median magnetized structure 230, 330, 430 made up of slices each formed of a set of elementary segments in the form of non-contiguous sectors, which facilitates adjustment after assembly.

As indicated above, the median annular magnetized structure 130 is divided into slices along the longitudinal axis z. These slices are always thinner along the axis z than the structures 111 and 121, but slices with non-contiguous elementary segments allow a greater thickness of each segment compared to an embodiment of the median annular magnetized structure with contiguous elementary segments. The various embodiments described may be combined with each other and, for example, it would be possible to produce a median annular magnetized structure including some slices with contiguous elementary segments and some slices with non-contiguous elementary segments, provided that symmetry relative to the plane P perpendicular to the axis z is complied with.

A few basic concepts useful for understanding the invention are briefly described below.

Usually, the region of interest (RoI) is outside the region of the sources of magnetic field and a pseudo-scalar magnetic potential may be defined such that:

$$\vec{B} = -\vec{\nabla}\Phi^*$$

This potential satisfies the Laplace equation:

$$\Delta\Phi^* = 0$$

In the situation of interest here, the region of interest may be represented as a sphere of center that is referred to as the origin. The Laplace equation may be expressed in a system of spherical coordinates and a unique expansion of the potential into spherical harmonics may be obtained, centered at the origin. The general solution for the potential may then be written:

$$\Phi^*(r, \theta, \phi) = \sum_{l=0}^{\infty} \sum_{m=-l}^{l} [A_{lm} r^l + B_{lm} r^{-(l+1)}] Y_{lm}(\theta, \phi),$$

where $$Y_{lm}(\theta, \phi) = \sqrt{\frac{2l+1}{4\pi} \frac{(l-m)!}{(l+m)!}} \, p_l^m(\cos\theta) \exp(im\phi)$$

Remembering that the potential exists only in empty space, space may be divided into two areas in which the potential exists: inside the largest sphere centered at the origin that does not contain any source and outside the smallest sphere centered at the origin that contains all the sources.

If the sources are situated outside this sphere, the expansion may be written as follows:

$$\Phi^*(r, \theta, \phi) = \frac{1}{\mu_0} \left\{ Z_0 + \sum_{n=1}^{\infty} r^n \left[ Z_n P_n(\cos\theta) + \sum_{m=1}^{n} (X_n^m \cos(m\phi) + Y_n^m \sin(m\phi)) P_n^m(\cos\theta) \right] \right\}$$

where the terms $Z_n$ are called the axial terms and the terms $X_n^m$ and $Y_n^m$ are called the non-axial terms.

On the basis of the above equation, it may be concluded that in order to obtain a homogeneous field it is necessary to find a distribution of the source that creates a potential for which the expansion contains only the term $Z_1$ (provided the field is the derivative of the potential and that the term $Z_0$ for the field corresponds to the term $Z_1$ for the potential). Strictly speaking, this is impossible, but as many terms as necessary may be eliminated to obtain the required homogeneity with a given radius r since the field varies with $$\left(\frac{r}{a}\right)^n$$

where a is a constant characteristic of the geometry. In conclusion, to obtain the required homogeneity, it is necessary to eliminate the first k orders until $$\left(\frac{r}{a}\right)^{k+1}$$

is sufficiently small.

It may also be deduced from the above equation that an axisymmetrical structure is advantageous in that it eliminates the non-axial terms. To obtain homogeneity of order n, the n symmetry of rotation guarantees that no non-axial term exists before order n Once the non-axial terms have been eliminated, the axial terms remain.

Another symmetry of interest is mirror symmetry or antisymmetry leaving only the even (or odd) axial terms. It is then possible to eliminate arbitrarily the 2p orders by arranging p+1 independent sources.

Thus non-linear optimization is possible. Moreover, the solution found may be expanded. The system may be expanded uniformly in all dimensions (constant scale factor) and made as large as possible, the homogeneity properties being unaffected and the amplitude of the magnetic field remaining constant.

The geometry of a device of the invention includes a plane of symmetry P containing the center of the structure and orthogonal to the axis z. The axis z is the axis of symmetry of the structure that is made up of various coaxial cylindrical elements pierced at their center to open up access to the center. A basic diagram of the structure may be seen in FIG. 1. As already indicated above, a principal cylinder is divided into two disks or rings 111, 121 with radial magnetization disposed on either side of the plane of symmetry P, one ring (ring 111) having its magnetization directed outward while the other ring (ring 121) has its magnetization directed inward. A set of slices of an annular structure 130 disposed between the rings 111 and 121 has a longitudinal magnetization along the axis z.

FIG. 5 shows all the orientations of the magnetizations in the overall structure 50. In the FIG. 5 example, the field created at the center of the axisymmetrical magnetized structure is directed upward.

The position and the dimensions along z of the longitudinal magnetization elements constituting the median annular magnetized structure 130 control homogeneity (by the method of eliminating axial terms). Moreover, the plane symmetry makes it possible to eliminate one axial term in two in the expansion into spherical harmonics. Thus achieving homogeneity of order 2p requires p+1 elements (because it remains to eliminate p terms).

Perfectly cylindrical elements as represented in FIG. 1 may be envisaged, but are not necessarily the most suitable for manufacture (geometrical imperfections, needing adjustments after assembly). The cylinder may however be approximated by a polygonal shape including sectors. This shape must have at least $2p_0$ symmetry to eliminate all non-axial terms up to order $2p_0$. $p_0+1$ slices must then be used to eliminate the remaining axial terms and to obtain a field homogeneous up to order $2p_0$. In the examples described, 12th order axial symmetry has been considered in order to be sure of the absence of non-axial terms, which implies a dodecagon. Moreover, eliminating the axial terms requires six elements (four slices of the median annular magnetized structure 130 and the two rings 111 and 121) to reach order 12.

FIGS. 8 to 11 show embodiments in which the geometry satisfies the various conditions for homogeneity.

Figure 9:
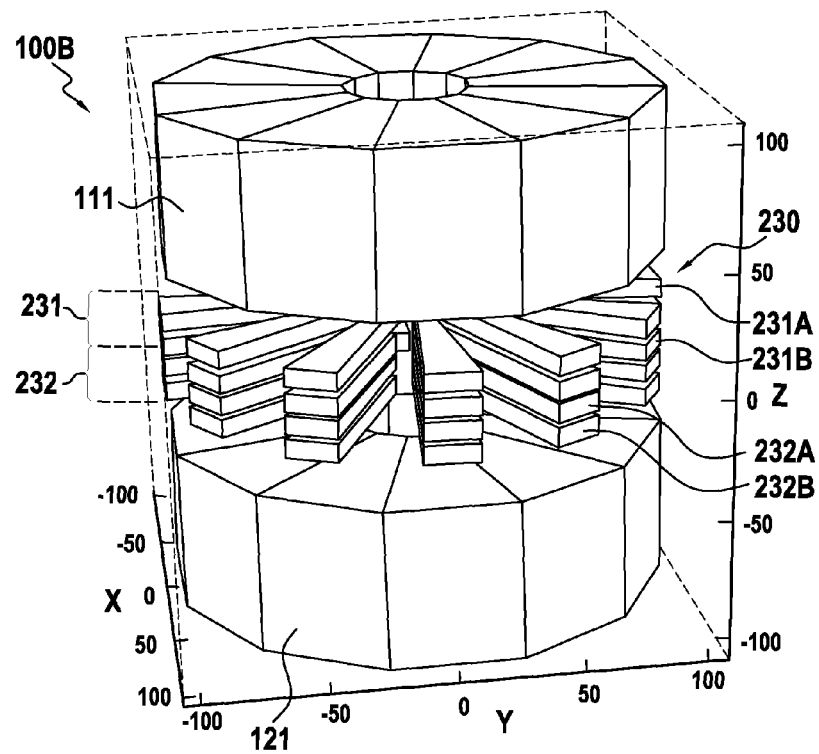
FIG. 9 is a perspective view of one embodiment of a magnetized structure of the invention of polygonal section and with a median annular magnetized structure including division into non-contiguous sectors, the sectors of the various slices being superposed.
Figure 10:
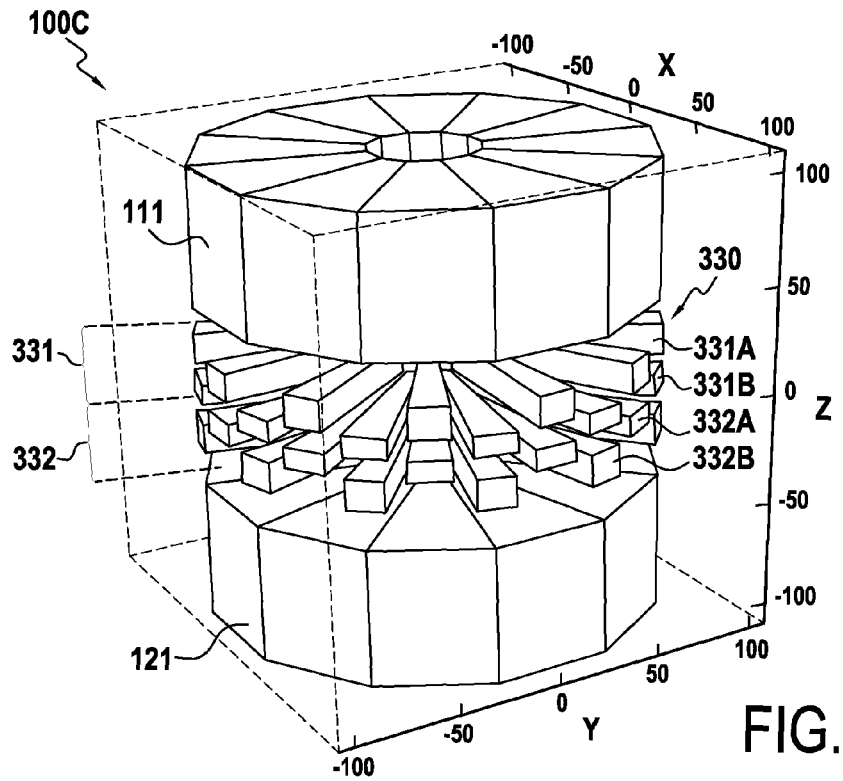
FIG. 10 is a perspective view of one embodiment of a magnetized structure of the invention of polygonal section and median annular magnetized structure including division into non-contiguous sectors, the sectors of each slice being offset relative to the sectors of the immediately adjacent slices.
Figure 11:
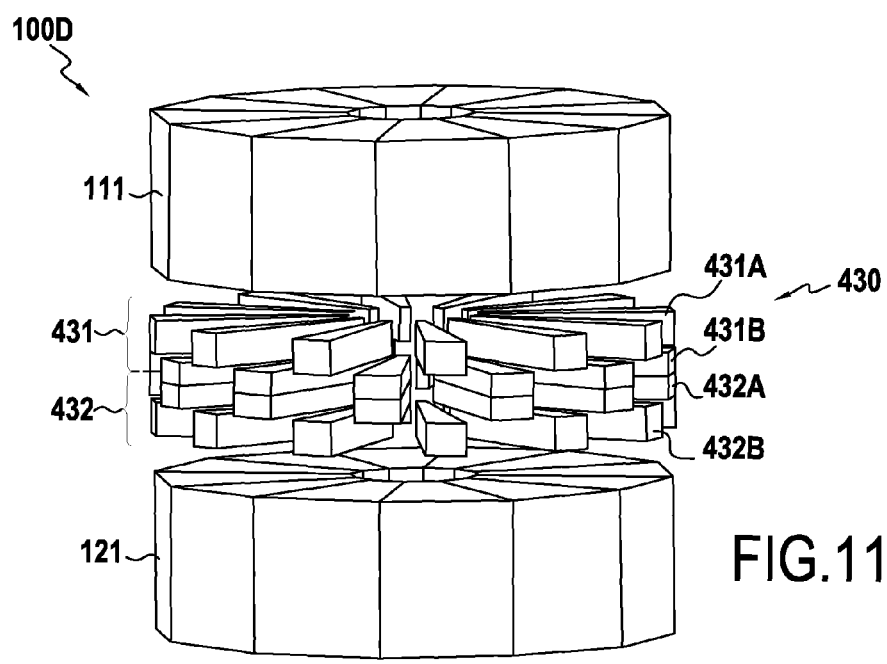
FIG. 11 is a perspective view of one embodiment of a magnetized structure of the invention of polygonal section and median annular magnetized structure including division into non-contiguous sectors, the sectors of the various slices being alternately offset relative to the sectors of an immediately adjacent slice and superposed on the sectors of an immediately adjacent slice.

FIG. 8 shows a structure 100A where each of the slices 131A, 131B, 132A, 132B of the longitudinal magnetization median annular structure is made up of contiguous elementary segments. These slices must therefore be relatively thin, which makes manufacture somewhat difficult. Preferred embodiments that solve this problem are shown in FIGS. 9 to 11. The structures 100B, 100C, and 100D given by way of example then include a median annular structure with longitudinal magnetization that comprises slices consisting of non-contiguous elementary segments that extend over a smaller angular sector and thus leave gaps between them. These non-contiguous elementary segments allow thicker slices to be formed that are less fragile than slices consisting of contiguous elementary segments. Non-contiguous elementary segments also offer the possibility of adjustment in three dimensions after assembly to correct manufacturing or assembly defects.

In the embodiment of FIG. 9, which shows an axisymmetric structure 100B in which the rings 111 and 121 with radial magnetization may be identical to the rings 111 and 121 of the FIG. 8 embodiment, the non-contiguous components of the various slices 231A, 231B, 232A, 232B of the median annular magnetized structure 230 are superposed on each other.

In the embodiment of FIG. 10, which shows a structure 100C in which the radial magnetization rings 111 and 121 may also be identical to the rings 111 and 121 of the embodiments of FIGS. 8 and 9, the non-contiguous components of each slice 331A, 331B, 332A, 332B of the median annular magnetized structure 330 are offset angularly (for example by 30°) relative to the non-contiguous components of the other immediately adjacent slices. This facilitates access for installing adjustment devices after assembly.

In the embodiment of FIG. 11, which shows a structure 100D in which the radial magnetization rings 111 and 121 may also be identical to the rings 111 and 121 of the embodiments of FIGS. 8 to 10, the non-contiguous components of the slices 431A, 431B, 432A, 432B of the median annular magnetized structure 430 are alternately offset angularly relative to the non-contiguous components of another immediately adjacent slice and superposed relative to the non-contiguous components of another, immediately adjacent slice.

The invention claimed is:

1. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors and in that all the components of each slice of the median annular magnetized structure are non-contiguous.

2. A magnetized structure according to claim 1, characterized in that the non-contiguous components of the various slices of the median annular magnetized structure are superposed on each other and aligned with each other along the longitudinal axis.

3. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that all the components of each slice of the median annular magnetized structure are non-contiguous in that the median annular magnetized structure is divided into at least four slices and in that the non-contiguous components of each slice of the median annular magnetized structure are offset angularly relative to the non-contiguous components of the other immediately adjacent slices.

4. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that all the components of each slice of the median annular magnetized structure are non-contiguous and in that the non-contiguous components of the slices of the median annular magnetized structure are alternately offset angularly relative to the non-contiguous components of the another immediately adjacent slice and superposed relative to the non-contiguous components of another immediately adjacent slice, being aligned therewith along the longitudinal axis.

5. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that the first and second magnetized rings have in the direction of the longitudinal axis a thickness greater than that of each slice of the median annular magnetized structure and in that:

the first and second magnetized rings and each slice of the median annular magnetized structure are divided into at least twelve sector-shaped components;

the interior and exterior cylindrical walls of the first and second magnetized rings and the median annular magnetized structure have a polygonal section in a plane perpendicular to said longitudinal axis;

all the components of the first and second magnetized rings are contiguous; and all the components of each slice of the median annular magnetized structure are non-contiguous.

6. A magnetized structure according to claim 5, characterized in that the non-contiguous components of the various slices of the median annular magnetized structure are superposed on each other and aligned with each other along the longitudinal axis.

7. A magnetized structure according to claim 6, characterized in that it is applied to a nuclear magnetic resonance device.

8. A magnetized structure according to claim 5, characterized in that it is applied to a nuclear magnetic resonance device.

9. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that the median annular magnetized structure is divided into at least four slices, in that:
the first and second magnetized rings and each slice of the median annular magnetized structure are divided into at least twelve sector-shaped components;
the interior and exterior cylindrical walls of the first and second magnetized rings and the median annular magnetized structure have a polygonal section in a plane perpendicular to said longitudinal axis;
all the components of the first and second magnetized rings are contiguous; and
all the components of each slice of the median annular magnetized structure are non-contiguous and in that the non-contiguous components of each slice of the median annular magnetized structure are offset angularly relative to the non-contiguous components of the other immediately adjacent slices.

10. A magnetized structure according to claim 9, characterized in that it is applied to a nuclear magnetic resonance device.

11. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that the first and second magnetized rings have in the direction of the longitudinal axis a thickness greater than that of each slice of the median annular magnetized structure, in that:
the first and second magnetized rings and each slice of the median annular magnetized structure are divided into at least twelve sector-shaped components;
the interior and exterior cylindrical walls of the first and second magnetized rings and the median annular magnetized structure have a polygonal section in a plane perpendicular to said longitudinal axis;
all the components of the first and second magnetized rings are contiguous; and
all the components of each slice of the median annular magnetized structure are non-contiguous and in that the non-contiguous components of each slice of the median annular magnetized structure are offset angularly relative to the non-contiguous components of the other immediately adjacent slices.

12. A magnetized structure according to claim 11, characterized in that it is applied to a nuclear magnetic resonance device.

13. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that the median annular magnetized structure is divided into at least four slices, in that:
the first and second magnetized rings and each slice of the median annular magnetized structure are divided into at least twelve sector-shaped components;
the interior and exterior cylindrical walls of the first and second magnetized rings and the median annular magnetized structure have a polygonal section in a plane perpendicular to said longitudinal axis;
all the components of the first and second magnetized rings are contiguous; and all the components of each slice of the median annular magnetized structure are non-contiguous and in that the non-contiguous components of the slices of the median annular magnetized structure are alternately offset angularly relative to the non-contiguous components of the another immediately adjacent slice and superposed relative to the non-contiguous components of another immediately adjacent slice, being aligned therewith along the longitudinal axis.

14. A magnetized structure according to claim 13, characterized in that it is applied to a nuclear magnetic resonance device.

15. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that the first and second magnetized rings have in the direction of the longitudinal axis a thickness greater than that of each slice of the median annular magnetized structure, in that:
the first and second magnetized rings and each slice of the median annular magnetized structure are divided into at least twelve sector-shaped components;
the interior and exterior cylindrical walls of the first and second magnetized rings and the median annular magnetized structure have a polygonal section in a plane perpendicular to said longitudinal axis;

all the components of the first and second magnetized rings are contiguous; and all the components of each slice of the median annular magnetized structure are non-contiguous and in that the non-contiguous components of the slices of the median annular magnetized structure are alternately offset angularly relative to the non-contiguous components of the another immediately adjacent slice and superposed relative to the non-contiguous components of another immediately adjacent slice, being aligned therewith along the longitudinal axis.

16. A magnetized structure according to claim 15, characterized in that it is applied to a nuclear magnetic resonance device.

17. A magnetized structure that induces in a central area of interest a homogeneous magnetic field oriented along a longitudinal axis of the structure, the structure comprising first and second magnetized rings disposed symmetrically relative to a plane that is perpendicular to said longitudinal axis and that contains said central area of interest, and one median annular magnetized structure disposed between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized along the longitudinal axis, the magnetized structure being characterized in that the median annular magnetized structure is divided into at least two slices along the longitudinal axis and the first and second magnetized rings and the various slices of the median magnetized structure are each divided into identical components in the form of regularly distributed sectors, in that the median annular magnetized structure is divided into at least four slices, in that:

the first and second magnetized rings and each slice of the median annular magnetized structure are divided into at least twelve sector-shaped components;

the interior and exterior cylindrical walls of the first and second magnetized rings and the median annular magnetized structure have a polygonal section in a plane perpendicular to said longitudinal axis;

all the components of the first and second magnetized rings are contiguous; and all the components of each slice of the median annular magnetized structure are non-contiguous, in that the non-contiguous components of the various slices of the median annular magnetized structure are superposed on each other and aligned with each other along the longitudinal axis and in that it is applied to a nuclear magnetic resonance device.

* * * * *